United States Patent
Torres et al.

(10) Patent No.: US 10,014,388 B1
(45) Date of Patent: Jul. 3, 2018

(54) TRANSIENT VOLTAGE SUPPRESSION DEVICES WITH SYMMETRIC BREAKDOWN CHARACTERISTICS

(71) Applicant: General Electric Company, Schenectady, NY (US)

(72) Inventors: Victor Mario Torres, Clifton Park, NY (US); Reza Ghandi, Niskayuna, NY (US); David Alan Lilienfeld, Niskayuna, NY (US); Avinash Srikrishnan Kashyap, Portland, OR (US); Alexander Viktorovich Bolotnikov, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/398,489

(22) Filed: Jan. 4, 2017

(51) Int. Cl.
| | |
|---|---|
| *H01L 29/74* | (2006.01) |
| *H01L 29/66* | (2006.01) |
| *H01L 29/36* | (2006.01) |
| *H01L 21/265* | (2006.01) |
| *H01L 21/306* | (2006.01) |
| *H01L 29/06* | (2006.01) |

(Continued)

(52) U.S. Cl.
CPC .. *H01L 29/66537* (2013.01); *H01L 21/26586* (2013.01); *H01L 21/30604* (2013.01); *H01L 29/0661* (2013.01); *H01L 29/0692* (2013.01); *H01L 29/1608* (2013.01); *H01L 29/2003* (2013.01); *H01L 29/24* (2013.01); *H01L 29/36* (2013.01); *H01L 29/7424* (2013.01); *H01L 29/7811* (2013.01); *H01L 29/8618* (2013.01)

(58) Field of Classification Search
CPC ............ H01L 29/7424; H01L 29/7811; H01L 29/1608; H01L 29/8613; H01L 29/0661
See application file for complete search history.

(56) References Cited

U.S. PATENT DOCUMENTS

| | | |
|---|---|---|
| 6,489,660 B1 | 12/2002 | Einthoven et al. |
| 7,554,839 B2 | 6/2009 | Bobde |

(Continued)

OTHER PUBLICATIONS

Urresti, J., et al.; "Low voltage TVS devices: design and fabrication", International Semiconductor Conference, http://ieeexplore.ieee.org/document/1105844/, Oct. 8-12, 2002.

(Continued)

*Primary Examiner* — Phat X Cao
(74) *Attorney, Agent, or Firm* — GE Global Patent Operation; Seema Katragadda

(57) ABSTRACT

The present disclosure relates to a symmetrical, punch-through transient voltage suppression (TVS) device includes a mesa structure disposed on a semiconductor substrate. The mesa structure includes a first semiconductor layer of a first conductivity-type, a second semiconductor layer of a second conductivity-type disposed on the first semiconductor layer, and a third semiconductor layer of the first conductive-type disposed on the second semiconductor layer. The mesa structure also includes beveled sidewalls forming mesa angles with respect to the semiconductor substrate and edge implants disposed at lateral edges of the second semiconductor layer. The edge implants including dopants of the second conductive-type are configured to cause punch-through to occur in a bulk region and not in the lateral edges of the second semiconductor layer.

14 Claims, 14 Drawing Sheets

(51) Int. Cl.
  *H01L 29/16* (2006.01)
  *H01L 29/20* (2006.01)
  *H01L 29/24* (2006.01)
  *H01L 29/861* (2006.01)
  *H01L 29/78* (2006.01)

(56) References Cited

U.S. PATENT DOCUMENTS

| | | | |
|---|---|---|---|
| 8,288,839 | B2 | 10/2012 | Guan et al. |
| 8,698,196 | B2 | 4/2014 | Guan et al. |
| 9,508,841 | B2 * | 11/2016 | Kashyap ............ H01L 29/1608 |
| 2002/0175391 | A1 * | 11/2002 | Einthoven ......... H01L 29/66121 257/497 |
| 2007/0077738 | A1 | 4/2007 | Tanielian et al. |
| 2009/0045457 | A1 | 2/2009 | Bobde |
| 2015/0092312 | A1 | 4/2015 | Govindarajan |
| 2016/0099318 | A1 * | 4/2016 | Bolotnikov ......... H01L 29/6606 257/76 |

OTHER PUBLICATIONS

Bouangeune, Daoheung, et al.; "Bidirectional Transient Voltage Suppression Diodes for the Protection of High Speed Data Line from Electrostatic Discharge Shocks", The Institute of Electronics Engineers of Korea, http://www.koreascience.or.kr/article/ArticleFullRecord.jsp?cn=E1STAN_2014_v14n1_1, vol. 14, Issue 1, pp. 1-7, 2014.

Li, Xiang, et al.; "Transient Voltage Suppressor Based on Diode-Triggered Low-Voltage Silicon Controlled Rectifier", Asia-Pacific International Symposium on Electromagnetic Compatibility, http://ieeexplore.ieee.org/document/7522744/, May 17-21, 2016.

* cited by examiner

TRANSIENT VOLTAGE SUPPRESSION DEVICES WITH SYMMETRIC BREAKDOWN CHARACTERISTICS

BACKGROUND

The subject matter disclosed herein relates to transient voltage suppression (TVS) devices, and more specifically, to TVS devices implemented as bidirectional diodes having symmetrical breakdown characteristics.

TVS devices are commonly used in electronic devices to protect components from power surges (e.g., transients, over-voltage conditions) in integrated circuits. TVS devices are generally either unidirectional or bidirectional. For an ideal bidirectional TVS device, the breakdown voltages ($V_B$) under positive and negative biases have substantially the same magnitude and, therefore, the breakdown voltage is symmetrical. However, for actual TVS devices, the magnitudes of breakdown voltages under positive and negative biases are often not identical, and the difference between these two values is referred to as the delta $V_B$ ($\Delta V_B$). In general, a TVS devices with a low $\Delta V_B$ enables similar protection from over-voltage conditions under both positive and negative voltage polarities.

In general, a bidirectional TVS diode can be a suitable TVS device for protecting electrical nodes whose signals are bidirectional or can have voltage levels both above and below a reference voltage, usually ground. There are different types of bidirectional TVS diodes, among which, punch-through diodes (e.g., Zener or punch-through breakdown) may be desirable for low voltage applications, where the punch-through occurs at a low voltage (e.g., below an avalanche breakdown voltage). However, a conventional bidirectional TVS diode may have shortcomings. In particular, due to various fabrication process limitations, the breakdown voltage of a conventional bidirectional TVS diode may not be symmetrical. As such, a conventional bidirectional TVS diode may not provide the same level of protection from both positive and negative over-voltage conditions.

BRIEF DESCRIPTION

Certain embodiments commensurate in scope with the originally claimed subject matter are summarized below. These embodiments are not intended to limit the scope of the disclosure. Indeed, the present disclosure may encompass a variety of forms that may be similar to or different from the embodiments set forth below.

In one embodiment, a symmetrical, punch-through transient voltage suppression (TVS) device includes a mesa structure disposed on a semiconductor substrate. The mesa structure includes a first semiconductor layer having a first doping concentration of a first conductivity-type. The mesa structure includes a second semiconductor layer of a second conductivity-type disposed on the first semiconductor layer, wherein the second semiconductor layer includes a bulk region having a second doping concentration of the second conductivity-type, and edge implants disposed at lateral edges of the second semiconductor layer adjacent to the bulk region and having a third doping concentration of the second conductivity-type. The mesa structure also includes a third semiconductor layer of the first conductive-type disposed on the second semiconductor layer. Further, the mesa structure includes beveled sidewalls that form mesa angles with respect to the semiconductor substrate that are less than 90 degrees, and the edge implants are configured to cause punch-through to occur in the bulk region and not in the lateral edges of the second semiconductor layer.

In another embodiment, a symmetrical punch-through transient voltage suppression (TVS) device includes a semiconductor substrate and a mesa structure disposed on the semiconductor substrate. The mesa structure includes a first N-type semiconductor layer having a first N-type dopant concentration. The mesa structure includes a P-type semiconductor layer disposed on the first N-type semiconductor layer, wherein the P-type semiconductor layer includes a bulk region having a first P-type dopant concentration and edge implants disposed at lateral edges of the P-type second semiconductor layer adjacent to the bulk region and having a second P-type dopant concentration. The mesa structure also includes a second N-type semiconductor layer having a second N-type dopant concentration disposed on the P-type semiconductor layer. Further, the mesa structure includes beveled sidewalls that form mesa angles with respect to the semiconductor substrate that are less than 90 degrees, and the edge implants are configured to cause punch-through to occur in the bulk region and not in the lateral edges of the second semiconductor layer.

In another embodiment, a method of manufacturing a punch-through transient voltage suppression (TVS) device includes forming a mesa structure. Forming the mesa structure includes forming a first epitaxial semiconductor layer having a first dopant concentration of a first conductivity-type on top of a semiconductor substrate, and forming a second epitaxial semiconductor layer having a second dopant concentration of a second conductivity-type on top of the first epitaxial semiconductor layer. Forming the mesa structure includes implanting dopants of the second conductivity-type along lateral edges of the second epitaxial semiconductor layer to form two edge implanted regions each having a third dopant concentration and a lateral length. Forming the mesa structure also includes forming a third epitaxial semiconductor layer having a fourth dopant concentration of the first conductivity-type on top of the second epitaxial semiconductor layer to form the mesa structure. The method also includes etching the mesa structure to form beveled sidewalls having mesa angles relative to the semiconductor substrate, wherein the mesa angles are less than 90 degrees.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
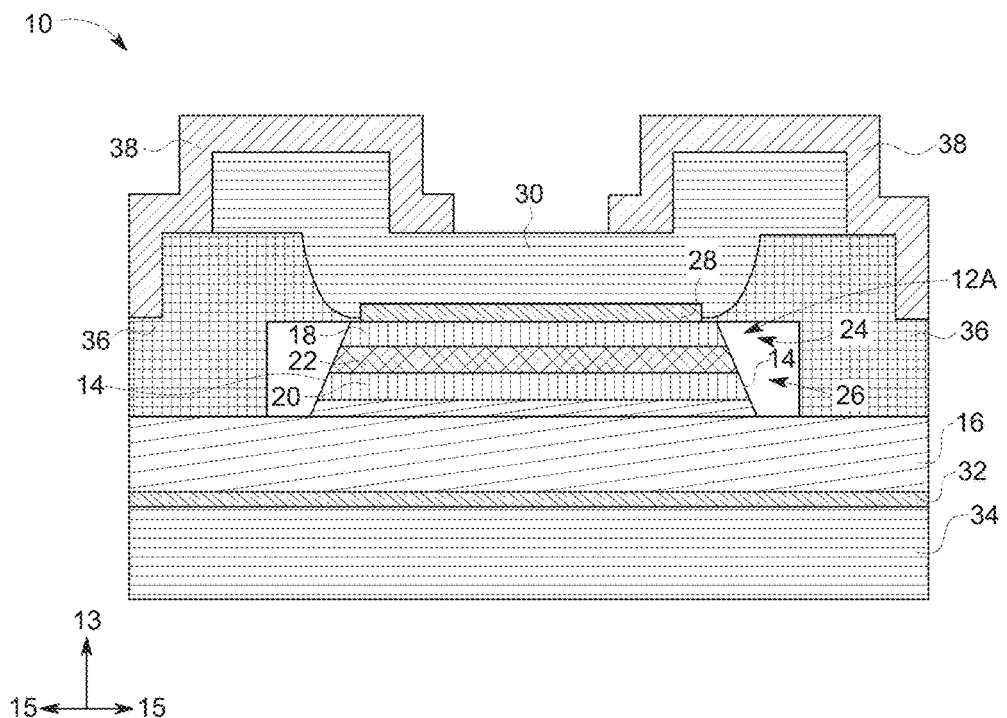
FIG. 1 is a cross-sectional view of a punch-through TVS device having a mesa structure, in accordance with embodiments of the present disclosure.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. The terms "substantially equal," "substantially the same" are intended to convey values that are exactly equal, or approximately equal, to one another. The term "about" and "approximately" as used herein is intended to convey a suitable value that is within a particular tolerance (e.g., ±10%, ±5%, ±1%), as would be understood by one skilled in the art of semiconductor fabrication.

As set forth above, an ideal TVS device (e.g., a TVS diode) is a bidirectional current carrying device where the magnitude of the $V_B$ is the substantially the same under positive (forward) and negative (reverse) biases. For actual TVS devices, when the $V_B$ values under positive ($V_{BP}$) and negative ($V_{BN}$) biases are different, the difference (e.g., $V_{BP}-V_{BN}$) is referred to as $\Delta V_B$. While a low $\Delta V_B$ is generally desirable, asymmetrical $V_B$ (e.g., $\Delta V_B > 0$) may arise due to fabrication process limitations, among others. For example, depending on the fabrication process limitations (e.g., uniform deposition, high aspect ratio etching, etc.), variations in the structure of the TVS diode (e.g., layout, geometry, dimension) may result in asymmetrical $V_B$. For example, the $\Delta V_B$ for an isolated TVS diode having a vertically-conducting mesa may increase when the interfaces between the mesa structure and an isolating dielectric layer of the TVS diode are not vertical and/or when the mesa isolation dielectric is significantly charged.

With this in mind, present embodiments are directed to a symmetric bidirectional punch-through TVS device (e.g., a TVS diode) that enables a symmetrical $V_B$, as well as methods of fabricating the same. The terms "symmetrical" or "symmetric" may be used herein to describe a device and/or the breakdown voltage thereof, and is intended to convey that the breakdown voltage in under an applied forward (positive) bias ($V_{BP}$) and the breakdown voltage in under an applied reverse (negative) bias ($V_{BN}$) are substantially the same, resulting in a low $\Delta V_B$ (e.g., less than about 1% of $V_{BP}$ or $V_{BN}$). As discussed below, the present disclosure enables the manufacture of TVS diodes having symmetrical $V_B$ (e.g., low $\Delta V_B$) despite including a mesa structure having beveled sidewalls as a result of etching. Therefore, while etching can result in a mesa structure of a TVS diode with beveled sidewalls, for present embodiments, a blocking layer (e.g., a middle semiconductor layer, the P-layer of a N-P-N structure) of the mesa structure includes edge implants that cause the TVS diode to uniformly break down away from the beveled edges of the mesa structure, resulting in a symmetrical $V_B$. As such, present embodiments enable greater freedom (e.g., fewer restrictions) on the fabrication process while still providing a symmetrical $V_B$ (e.g., low $\Delta V_B$).

FIG. 1 is a cross-sectional view of a punch-through TVS device 10 including a mesa structure 12A having beveled edges 14, in accordance with embodiments of the present approach. As shown, the punch-through TVS device 10 may be described with reference to a vertical axis 13 and a lateral axis 15. In the illustrated embodiment, the mesa structure 12A is formed on or above a substrate 16 (e.g., a semiconductor substrate). The substrate 16 may be formed of wide bandgap materials, for example silicon carbide (SiC), gallium nitride (GaN), gallium oxide ($Ga_2O_3$), etc, in different embodiments.

The mesa structure 12A includes two epitaxial (epi) layers of a first conductivity-type (e.g., N+) 18 and 20 respectively disposed above and below an epitaxial layer of a second conductivity-type (e.g., P-type) 22, yielding an N-P-N or a P-N-P structure having an upper P-N junction 24 and a lower P-N junction 26. By specific example, in certain embodiments, the mesa structure 12A may include a heavily-doped N+ layer 20 disposed on the substrate 16, a lightly-doped P-layer 22 disposed on the heavily-doped N+ layer 20, and a heavily-doped N+ layer 18 disposed on the lightly-doped P layer 22. As illustrated, a contact metal layer 28 is formed on the epi layer 18, coupled to a front metal layer 30 (e.g., anode). Another contact metal layer 32 is coupled to the substrate 16 on the opposite side of the mesa 12A, coupled to a back side metal 34 (e.g., cathode) for the illustrated embodiment. In addition, the illustrated punch-through TVS device 10 is electrically isolated by a field oxide layer 36 and a passivation layer 38, such that the punch-through TVS device 10 may be fabricated alongside other semiconductor devices (e.g., field effect transistors (FETs) in an integrated circuit.

Figure 2:
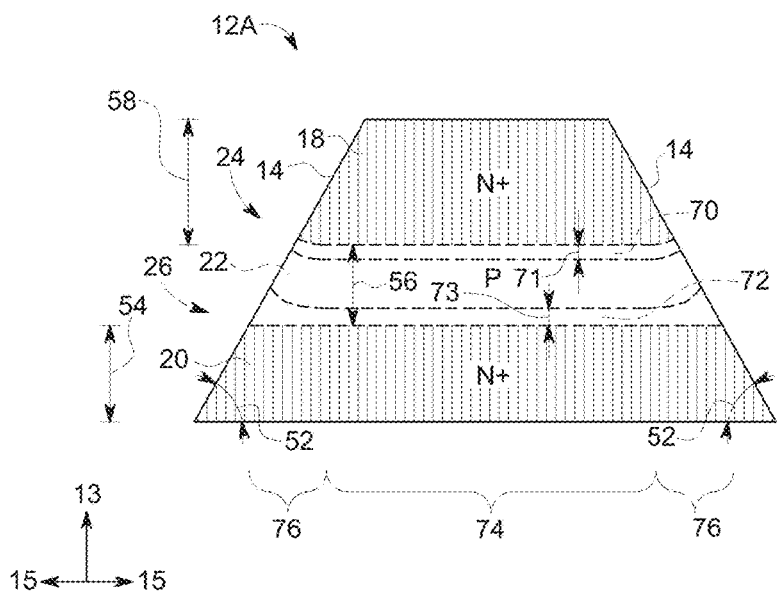
FIG. 2 is a cross-sectional view of a mesa structure of a punch-through TVS device, wherein the mesa structure has beveled sidewalls, in accordance with embodiments of the present disclosure.

FIG. 2 is a cross-sectional view the mesa structure 12A of the TVS diode 10 illustrated in FIG. 1, in accordance with embodiments of the present disclosure. In the illustrated embodiment, the mesa structure 12A has sidewalls 14, which form mesa angles 52 with respect to the underlying substrate 16, as illustrated in FIG. 1. The mesa sidewalls 14 are beveled (e.g., sloped or offset from the vertical axis 13) and the mesa angles 52 are smaller than 90 degrees (e.g., not perpendicular). It should be noted that such beveled mesa sidewalls 14 may be formed, intentionally or inadvertently, during fabrication processes of the mesa structure 12A. For example, the beveled sidewalls 14 may be unavoidably formed during a mesa etching process. By specific example, the etching of certain types of epitaxial layers (e.g., SiC layers), can be challenging due to the aggressive etching conditions involved, or the low selectively between masking materials (e.g., $SiO_2$ photoresist) and the substrate (e.g., SiC substrate), or a combination thereof The embodiment of the mesa structure 12A illustrated in FIG. 2 includes the heavily-doped N+ layer 20 having a thickness 54, the lightly-doped P-layer 22 having a thickness 56, and the heavily-doped N+ layer 18 having a thickness 58, wherein the thicknesses 54 and 58 are substantially equal to one another and are greater than the thickness 56. It may be appreciated that the thicknesses 54, 56, and 58 may be increased or decreased individually or collectively to achieve a desired $V_B$. It may be generally appreciated that a depletion region is formed when two semiconductors of opposite conductivity-type meet at a junction. In the illustrated embodiment, a first depletion region 70 having a depletion width 71 is formed between the heavily-doped N+ layer 18 and the lightly-doped P-layer 22 (e.g., at the upper P-N junction 24), and a second depletion region 72 having a depletion width 73 is formed between the lightly-doped P-layer 22 and the heavily-doped N+ layer 20 (e.g., at the lower P-N junction 26).

It may be appreciated that the charge in the depletion region on one side of the junction (e.g., on the N-side) balances the charge on the other side of the junction (e.g., on the P-side). In other words, for the junctions 24 and 26 of the mesa 12A, $N_a W_p = N_d W_n$, where $N_a$ represents the concentration of the negatively charged acceptors on the P-side, $N_d$ represents the positively charged donors on the N-side, and $W_p$ and $W_n$ are the depletion widths on the P- and N- sides, respectively. For the embodiment illustrated in FIG. 2, the lightly-doped P-layer 22 may be described as having a central or bulk region 74 (e.g., not adjacent to the beveled sidewalls 14), in which the depletion regions 70 and 72 are substantially flat (e.g., not curved, constant depletion widths 71 and 73). Further, for the embodiment illustrated in FIG. 2, the lightly-doped P-layer 22 may be described as having lateral edges 76 that extend away from the bulk region 74 (e.g., along the lateral axis 15) in which the depletion regions 70 and 72 are curved (e.g., not flat, include non-uniform depletion widths 71 and 73), as discussed below.

For the first depletion region 70 of the mesa structure 12A of FIG. 2, the volume of semiconductor material near the lateral edges 76 in the upper P-N junction 24 is greater for the lightly-doped P-layer 22 than for the heavily-doped N+ layer 26. Accordingly, to maintain the charge neutrality, in the lateral edges 74 of the lightly-doped P-layer 22, the first depletion region 70 bends or curves upward toward the heavily-doped N+ layer 18. As a result of this bending, the width 71 of the depletion region 70 is thicker in the bulk region 74 than at the lateral edges 76 of the lightly-doped P-layer 22. The concave curvature (with respect to the current flow direction) of the first depletion region 70 near the lateral edges 76 of the lightly-doped P-layer 22 results in punch-through occurring in the bulk region 74. For the second depletion region 72, however, the volume of the semiconductor material near the lateral edges 76 of the lower P-N junction 26 is smaller for the lightly-doped P-layer 22 than for the heavily-doped N+ layer 20. Accordingly, to maintain the charge neutrality, in the lateral edges 74 of the lightly-doped P-layer 22, the second depletion region 72 bends or curves upward toward the lightly-doped P-layer 22. As a result of this bending, the width 73 of the depletion region 72 is thicker at the lateral edges 76 than in the bulk region 74 of the lightly-doped P-layer 22. The convex curvature (with respect to the current flow direction) of the second depletion region 72 results in punch-through occurring at a lower voltage (e.g., lower than the $V_B$ at the first depletion region 70) neat the lateral edges 76.

When a reverse or negative bias is applied across a P-N junction, punch-through occurs at a sufficiently high reverse bias ($V_{BN}$) when current flows across the depletion layer or region (e.g., the first depletion region 70, the second depletion region 72) with a depletion width (W) (e.g., the width 71, the width 73). In the illustrated embodiment, the lightly doped P-layer 22 acts as a current blocking layer. More specifically, the depletion layer (e.g., the first depletion region 70, the second depletion region 72) blocks the current flow with an effective charge-blocking thickness that is defined by a relationship t–W, wherein t is the thickness of the current blocking layer (e.g., thickness 56) and W is the thickness of the depletion layer (e.g., the width 71, the width 7). Therefore, the effective charge-blocking thickness (t–W) decreases with increasing depletion width (W). In other words, the $V_B$ of the P-N junction is dictated by the voltage required for the current to punch through a depletion layer having an particular effective charge-blocking thickness, and the $V_B$ increases with increasing effective charge-blocking thickness (e.g., due to more effective current blocking). For the mesa structure 12A with the beveled mesa sidewalls 14, as shown in FIG. 2, because the depletion widths 71 and 73 for the upper and lower junctions 24 and 26 are different (e.g., the W values are different), the effective charge-blocking thickness, and hence the $V_B$ for the upper and lower junctions 24 and 26, are different. In particular, in FIG. 2, the effective charge-blocking thickness is greater in the upper junction 24 than in the lower junction 26, because the W of the upper junction 24 (e.g., the depletion width 71 in the bulk region 74) is smaller than the W of the lower junction 26 (e.g., the depletion width 72 at the lateral edges 76). Accordingly, the $V_B$ of the upper junction 24 is greater than the $V_B$ of the lower junction 26, $\Delta V_B$ is greater than zero, and the breakdown voltage is asymmetrical for an embodiment of the TVS diode 10 having the illustrated mesa structure 12A of FIG. 2.

Based on the foregoing, it may be appreciated that as the mesa angles 52 increase, the bending of the first and second depletion regions 70 and 72 in the lateral edges 76 of the mesa 12A becomes less significant, and the effective charge-blocking thicknesses of the upper and lower junctions 24 and 26 become substantially the same. Accordingly, as the mesa angles 52 fall below 90 degrees, the $\Delta V_B$ typically increases and the punch-through of the TVS device 10 has unsymmetrical voltage breakdown characteristics.

One approach to achieve a TVS device having symmetrical voltage breakdown characteristics is to fabricate the mesa structure 12A having vertical mesa sidewalls 14 (e.g., mesa angles 52 greater than about 80 degrees, approaching 90 degrees). However, as set forth above, due to fabrication limitations, it may be impractical or cost-prohibitive to fabricate vertical mesa sidewalls due to stringent etching requirements, and more often the mesa sidewalls 14 are beveled rather than vertical. The high chemical stability of SiC, for example, makes a well-controlled, vertical mesa profile with acceptable surface damage difficult to fabricate. More specifically, due to the chemical stability of SiC, a combination of gases (e.g., sulfur hexafluoride ($SF_6$), oxygen ($O_2$), argon (Ar) and high-powered plasma are used to produce species that are sufficiently volatile to achieve desirable etch rates for etching SiC. In addition, in certain embodiments, passivating species may be supplied along the walls of the mesa in order to control the slope profile during etching. Additionally, the etching chemistry should be selective against etching of masking layers, such as $SiO_2$ or photoresist, as significant etching of the masking materials can also result in undesired etch profiles. Further, the plasma power should be suitably tuned to provide sufficient ion bombardment to aid reaction product desorption, and at the same time to avoid poor mesa profile (e.g. bowing or micro-trenching) or excessive sidewall roughness. Finally, care should be taken to avoid exposing any open areas adjacent to the mesa 12A to unwanted ion bombardment during etching as this can cause or increase the sloping of the sidewalls 14. Accordingly, achieving a vertical mesa sidewall by precise control of mesa etching parameters is difficult and cumbersome.

Figure 3:
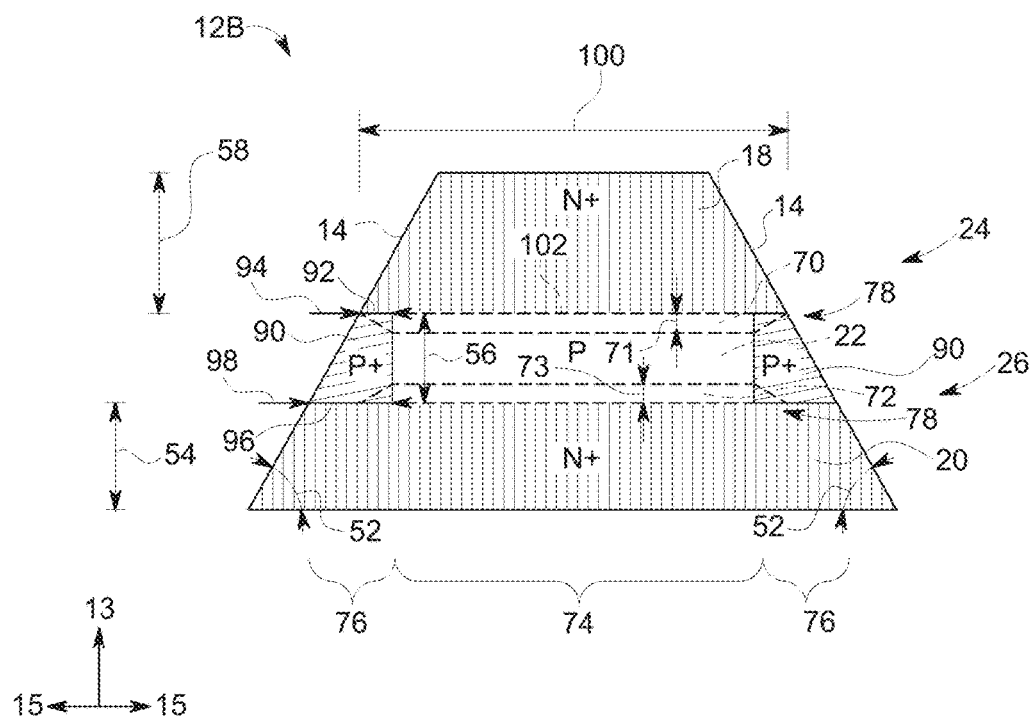
FIG. 3 is a cross-sectional view of a mesa structure of a punch-through TVS, wherein the mesa structure has beveled sidewalls with edge implants, in accordance with embodiments of the present disclosure.

With the foregoing challenges to achieving a vertical mesa sidewall in mind, another approach to achieving a symmetrical TVS device is to fabricate a mesa structure in which punch-through occurs exclusively in the bulk region 74, as opposed to near the lateral edges 76, to reduce or eliminate $\Delta V_B$. FIG. 3 is a cross-sectional view of another embodiment of mesa structure 12B, similar to the mesa structure 12A of FIG. 2, of a TVS device 10, as illustrated in FIG. 1. However, in contrast with the mesa structure 12A of FIG. 2, the mesa structure 12B of FIG. 3 has beveled sidewalls 14 that include edge implants 90 having the same conductivity-type as the epitaxial layer 22. For the illustrated embodiment, these edge implants 90 are heavily-doped P+ regions 90 that occupy the lateral edges 76 of the lightly-doped P-layer 22 and that improve the symmetrical voltage breakdown characteristics of the mesa 12B. As will be discussed below, these edge implants 90 enable the manufacture of a mesa structure 12B having mesa angles 52 less than 90 degrees that demonstrates symmetrical voltage breakdown characteristics. For example, in certain embodiments, the mesa angles 52 may be about 85 degrees, about 80 degrees, or about 75 degrees. In other embodiments, the mesa angles 52 may be between about 30 degrees and about 85 degrees. The epi layers 18 and 20 may have equal or substantially equal thickness (e.g., the thicknesses 54 and 58 are equal or substantially equal to one another). Additionally, in certain embodiments, the epi layers 18 and 20 may each have a dopant concentration that is at least two orders of magnitude (e.g., 100×) higher than a dopant concentration in the bulk region 74 of the epi layer 22. Further, the epi layers 18 and 20 may be thicker than the epi layer 22 (e.g., the thicknesses 54 and 58 are greater than the thickness 56). As discussed above, the thicknesses 54, 56, and 58 of the epi layers 20, 22, and 18, respectively, may be changed individually and/or collectively to achieve a desired $V_B$. For example, in certain embodiments, the thicknesses 54 and 58 are greater than about 0.3 micrometer (µm).

The edge implants 90 may be described as each having a top edge 92 with a first lateral length 94, and a bottom edge 96 with a second lateral length 98. The epi layer 22 has a lateral length 100 at an interface 102 adjacent to upper epi layer 18. A ratio between the first lateral length 94 and the lateral length 100 is referred as $R_{P+}$ (e.g., $R_{P+}$=lateral length 94/lateral length 100). In one embodiment, $R_{P+}$ may be about 0.1%, about 0.5%, about 1%, between about 1% and about 5%, or any values therebetween. In one embodiment, $R_{P+}$ is changed based on the mesa angles 52, dimensions of the mesa structure 12B (e.g., the lateral length 100), among other factors. For example, the first lateral length 94 and/or the $R_{P+}$ may be greater if the mesa angles 52 are relatively smaller, and vice versa. In certain embodiments, the first lateral length 94 may be between about 1 µm and about 10 µm.

The edge implants 90 generally have a dopant concentration ($C_{P+}$) that is greater than a dopant concentration ($C_P$) in the more lightly-doped epi layer 22. In one embodiment, $C_{P+}$ is between about 100% and about 150% greater than $C_P$. In one embodiment, the increase in dopant concentration (e.g., $C_{P+}-C_P$) is referred as $\Delta C_{P+}$, and $\Delta C_{P+}$ may change at least based on the mesa angles 52, and/or the dimension of the heavily-doped P+ regions 90 (e.g., the first lateral length 94), among other factors. For example, the $C_P$+and/or $\Delta C_{p+}$ may be greater if the mesa angles 52 are relatively smaller, and vice versa. For example, in certain embodiments, the $C_{P+}$ may be about $2 \times 10_{17}$ cm$^{-3}$.

It may be appreciated that, since depletion width decreases with increasing doping concentration, due to the presence of the edge implants 90, the depletion widths 71 and 73 of the upper and lower P-N junctions 24 and 26 are reduced in the lateral edges 76 of the epi layer 22, as indicated by the arrows 78, compared to the bulk region 74. Because the depletion regions 70 and 72 are thinner (e.g., pinch off) in near the lateral edges 76 and thicker in the bulk region 74 of the layer 22, as an applied positive (forward) or negative (reverse) bias increases in magnitude, a critical electric field is reached sooner (e.g., punch-through occurs) in the bulk region 74, where the depletion widths 71 and 73 are relatively thicker. Because the depletion widths 71 and 73 of the upper and lower junctions 24 and 26 are substantially equal to one another in the bulk region 74 of the epi layer 22, the $V_B$ for the upper junction 24 is substantially equal to the $V_B$ for the lower junction 26. Accordingly, the $\Delta V_B$ may be significantly reduced or completely eliminated such that the breakdown voltage is symmetrical. In other words, the breakdown voltage is more symmetrical (e.g., reduced $\Delta V_B$) when the punch-through occurs in the bulk region 74 rather than near the lateral edges 76 of the layer 22. It should be noted that the $C_{P+}$ and the first lateral length 94 of the edge implants 90 may be individually and/or collectively tuned to promote punch-through to occur in the bulk region 74 rather than near the lateral edges 76 of the mesa structure 12B, in accordance with the present disclosure.

FIGS. 4A-D are graphical representations of simulated breakdown voltage characteristics. More specifically, FIGS. 4A-D compare the breakdown voltage characteristics of a punch-through TVS device 10 having the mesa structure 12A with beveled sidewalls 14 (as illustrated in FIG. 2) versus a punch-through TVS device 10 having the mesa structure 12B with beveled sidewalls 14 that include edge implants 90 (as illustrated in FIG. 3), in accordance with embodiments of the present disclosure. For FIGS. 4A-D, the horizontal axes represent the reverse bias voltage, and the vertical axes represent the leakage current.

Figure 4A:
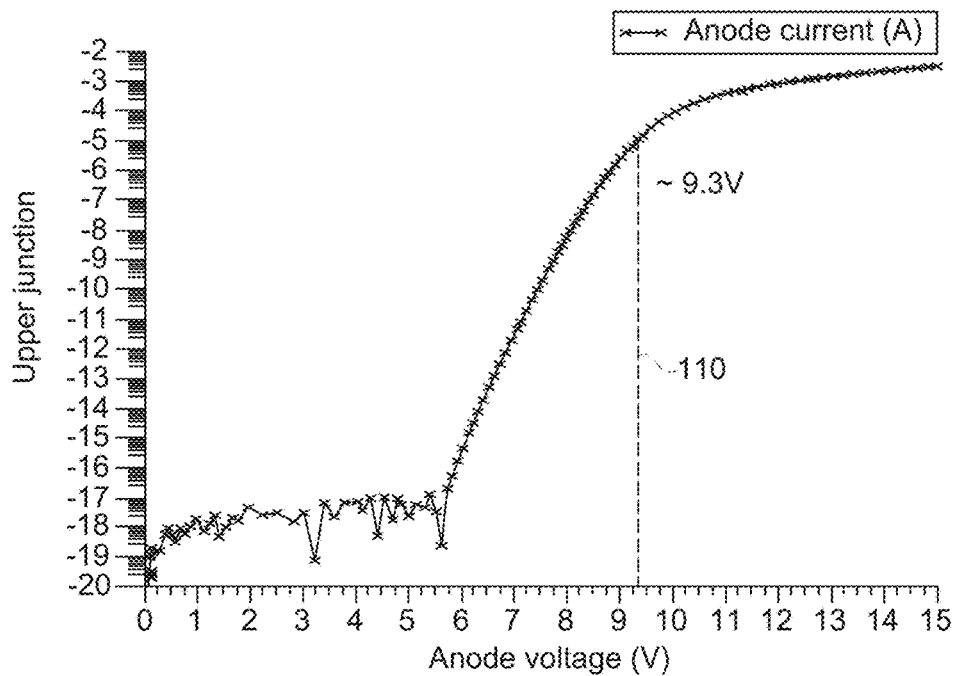
FIGS. 4A, 4B, 4C, and 4D are graphical representations of a comparison between voltage breakdown characteristics for the punch-through TVS device illustrated in FIG. 2 versus the punch-through TVS device illustrated in FIG. 3, in accordance with embodiments of the present disclosure.
Figure 4B:
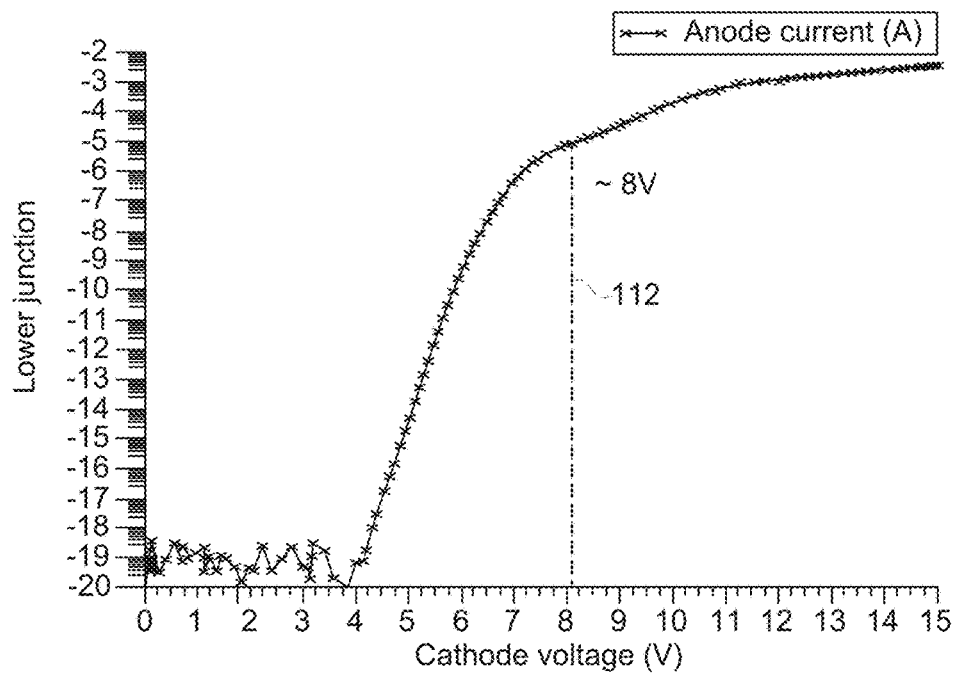

In particular, the graphs shown in FIGS. 4A and 4B represent the reverse biased I-V characteristics of the upper junction 24 and the lower junction 26, respectively, for the mesa structure 12A illustrated in FIG. 2, which lacks the edge implants 90. Based on the illustrated I-V curves, punch-through occurs at about 9.3 V in the upper junction 24, as indicated by the vertical line 110, and about 8 V in the lower junction 26, as indicated by the vertical line 112. As such, FIGS. 4A and 4B are consistent with the foregoing discussion of FIG. 2 that due to the beveled mesa sidewalls 14 and associated edge effects, punch-through occurs at a relatively greater $V_B$ for the upper junction 24 and at a relatively smaller $V_B$ for the lower junction 26. In this case, the difference in the $V_B$ values (e.g., about 9.3 V and about 8 V) demonstrate an asymmetrical breakdown voltage, with a $\Delta V_B$ of about 1.3 V.

Figure 4C:
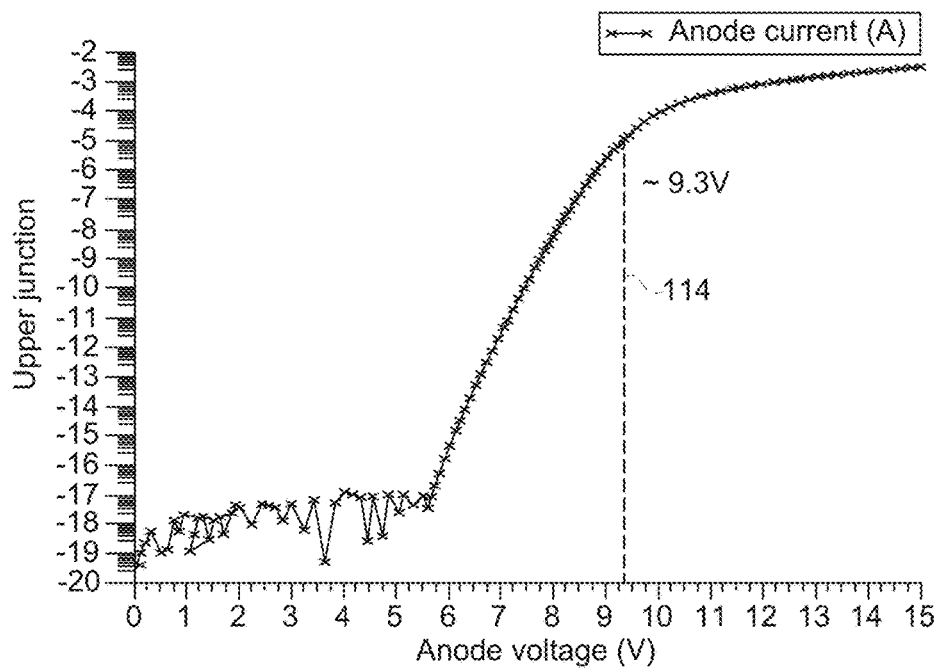
Figure 4D:
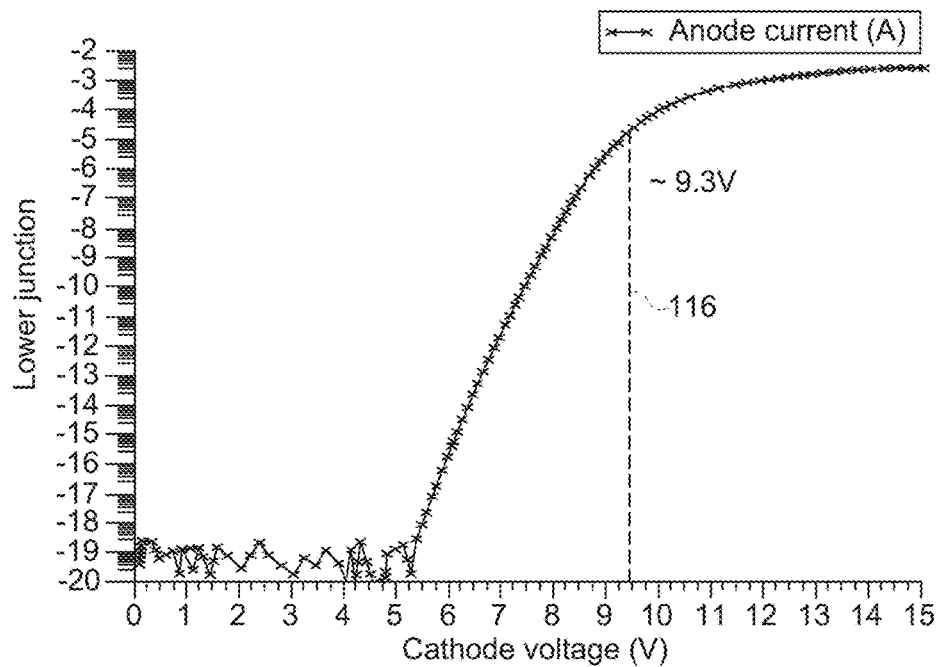

The graphs shown in FIGS. 4C and 4D represent the reverse-biased I-V characteristics for the upper junction 24 and the lower junction 26, respectively, for the mesa structure 12B illustrated in FIG. 3, which includes the edge implants 90. Based on the illustrated I-V curves, as indicated by the lines 114 and 116, punch-through occurs at about 9.3 V in both the upper and lower junctions 24 and 26. This is consistent with the foregoing discussion of FIG. 3, where as a result of the edge implants 90, punch-through occurs in the bulk region 74, in which $V_B$ is unaffected by the beveled mesa sidewalls 50 and the associated effects thereof. As indicated in FIGS. 4C and 4D, there is no substantial difference in the $V_B$ values (e.g., both are about 9.3 V), and the $\Delta V_B$ is about 0 V, indicating symmetrical breakdown voltage characteristics.

FIGS. 5 and 6 are graphical representations of simulated potential distributions and current distributions for TVS devices 10 under reverse bias. More specifically, FIGS. 5A-D represent a punch-through TVS device 10 having the mesa structure 12A illustrated in FIG. 2 that lacks the edge implants 90, while FIGS. 6A-D represent a punch-through TVS device 10 having the mesa structure 12B illustrated in FIG. 3 that includes the edge implants 90, in accordance with embodiments of the present disclosure. For the represented embodiments, the potential and current distribution plots for the reverse-biased upper and lower junctions 24 and 26 are presented as contour graphs plotted at a resolution of 1 ampere per square centimeter (A/cm²). Each region or isosurface enclosed by a respective voltage isotherm has a substantially the same voltage, and each region or isosurface enclosed by a respective current isotherm has substantially the same current. The lighter-shaded regions represent higher potential or current and the darker-shaded regions represent lower potential or current, in accordance with the keys 118.

Figure 5A:
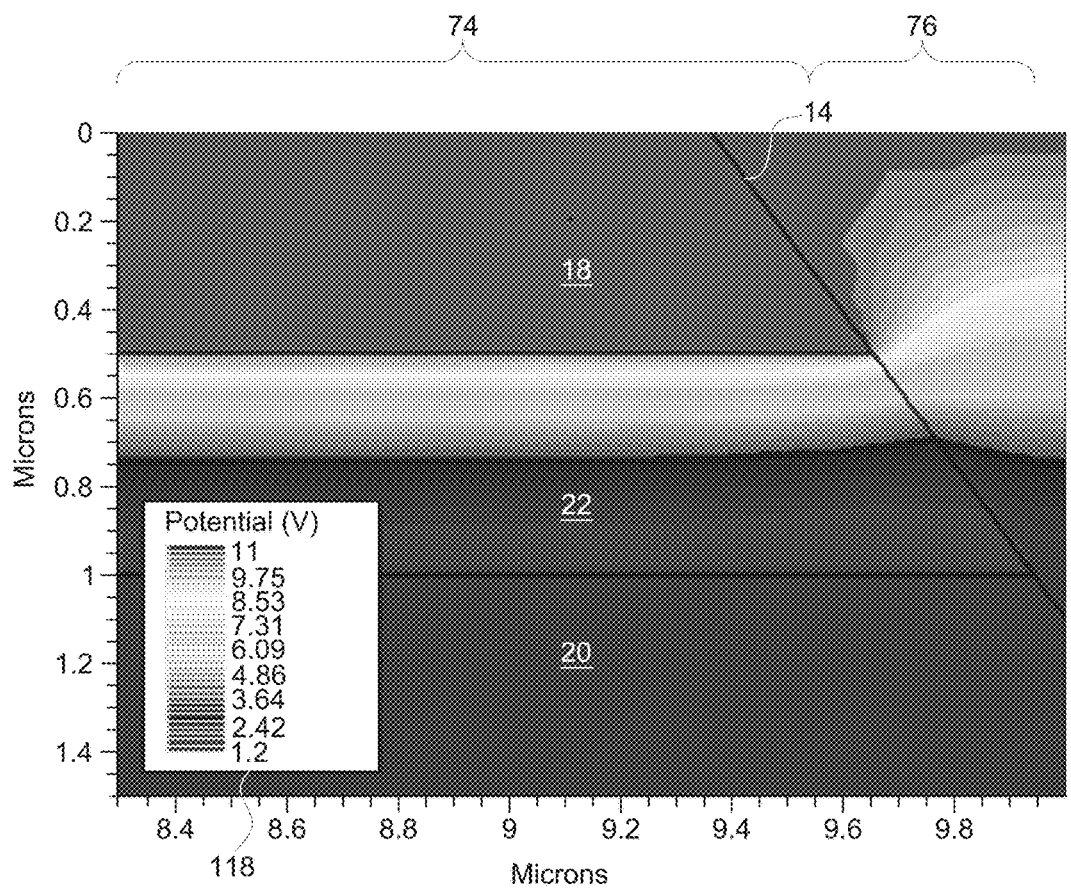
FIGS. 5A, 5B, 5C, and 5D are a graphical representations of potential distributions and current distributions of an upper junction and a lower junction of a punch-through TVS device having the mesa structure of FIG. 2 under reverse-bias, in accordance with embodiments of the present disclosure.
Figure 5B:
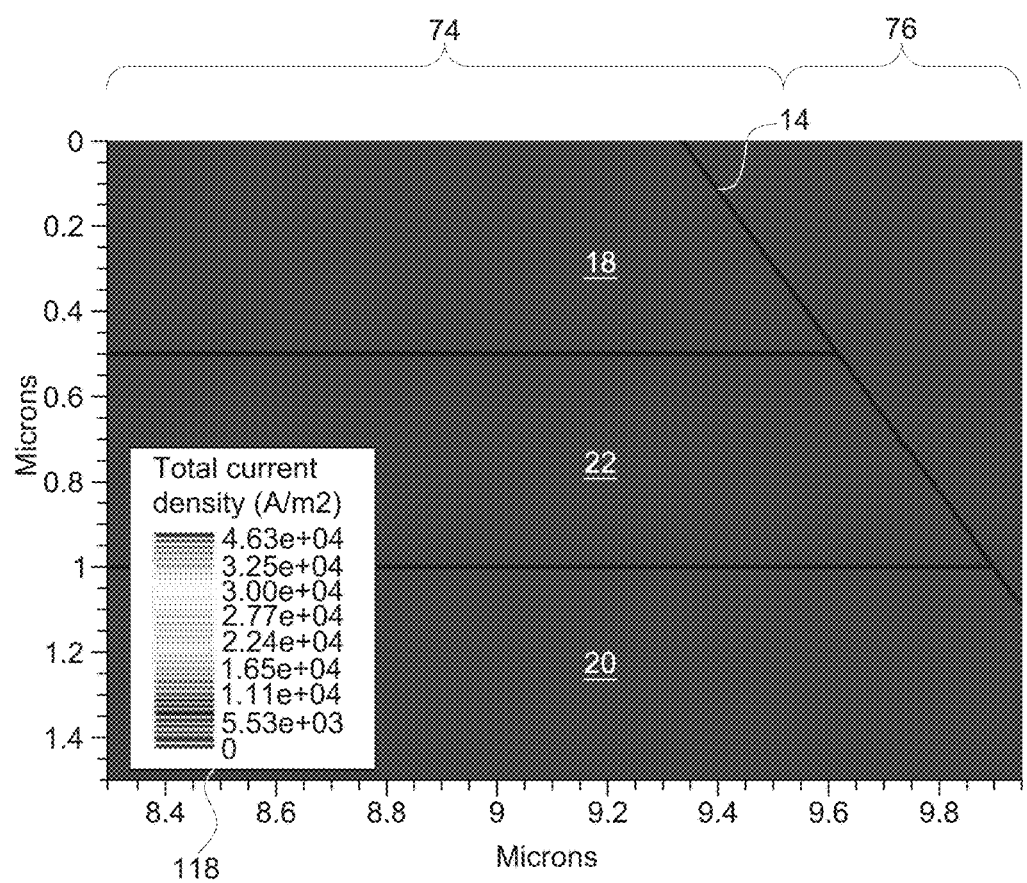
Figure 5C:
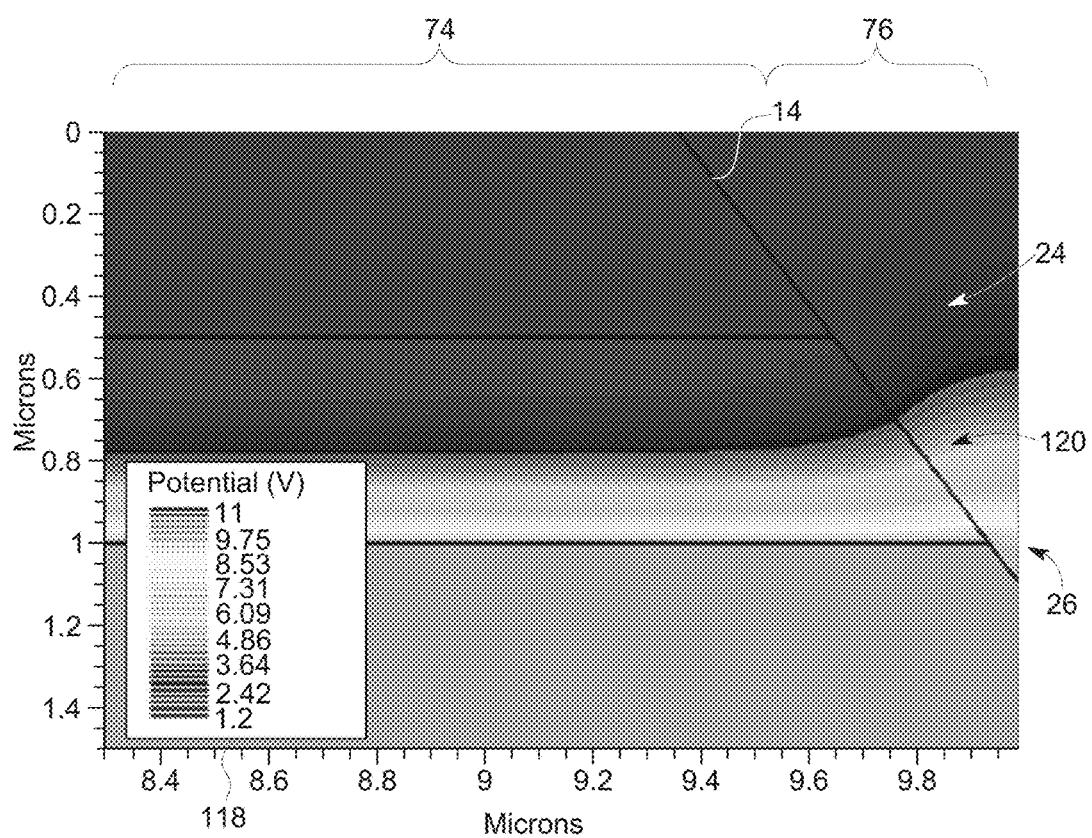
Figure 5D:
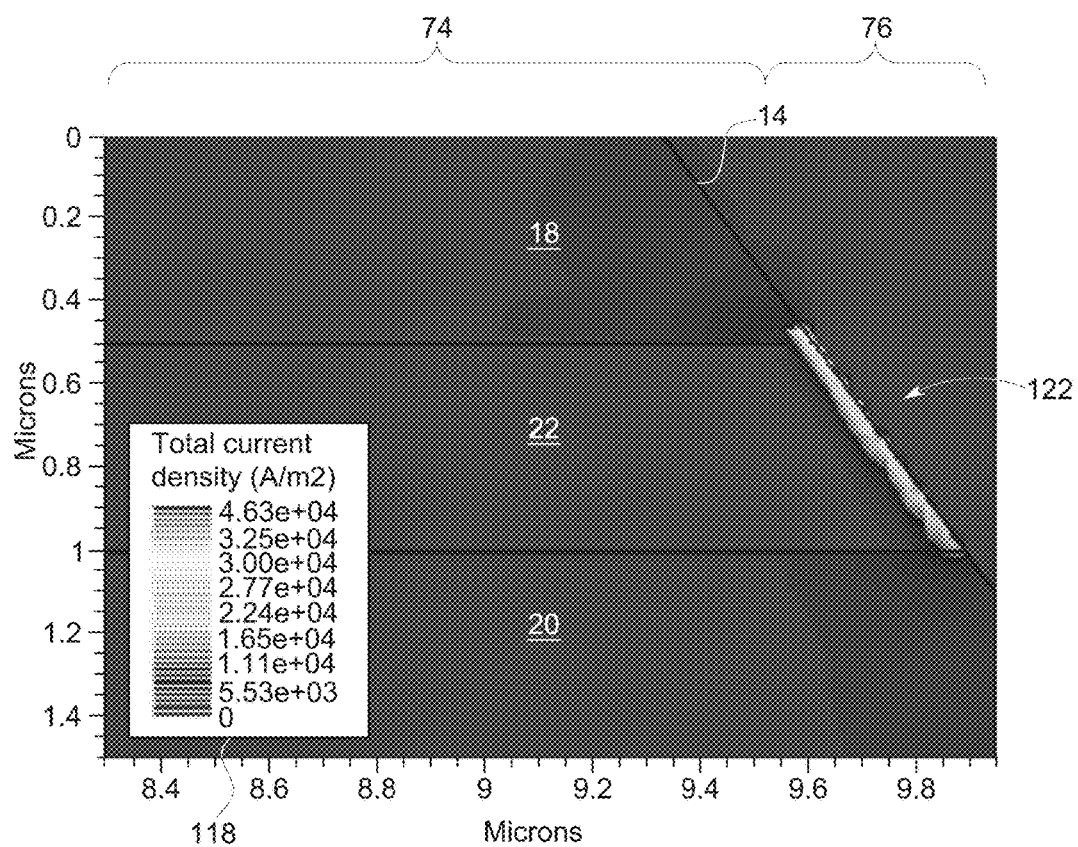

In particular, FIG. 5A represents the potential distribution, and FIG. 5B the current distribution, for the upper junction 24 of a punch-through TVS device 10 having the mesa structure 12A illustrated in FIG. 2 that lacks the edge implants 90. FIG. 5C represents the potential distribution, and FIG. 5D the current distribution, for the lower junction 26 of the same device under reverse (negative) bias. As illustrated in FIG. 5C, punch-through occurs at a lower bias in the lower junction 26 near the lateral edges 76, as indicated by the potential and current accumulations in regions indicated by arrows 120 and 122, respectively. It should also be noted that without the edge implants 90, a leakage current (e.g., as indicated by the arrow 122) is illustrated as flowing through the lower junction 26 along the beveled mesa sidewall 50, as illustrated in FIG. 5D.

Figure 6A:
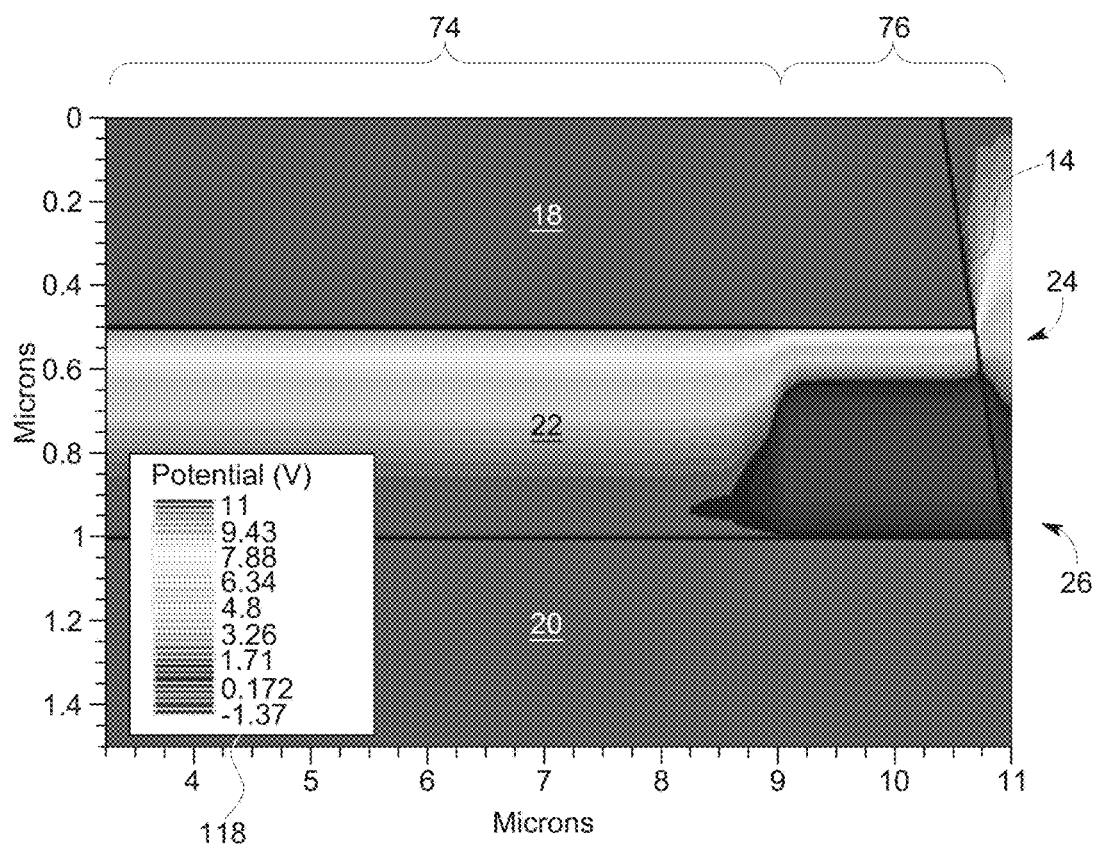
FIGS. 6A, 6B, 6C, and 6D are a graphical representations of potential distributions and current distributions of an upper junction and a lower junction of a punch-through TVS device having the mesa structure of FIG. 3 under reverse-bias, in accordance with embodiments of the present disclosure.
Figure 6B:
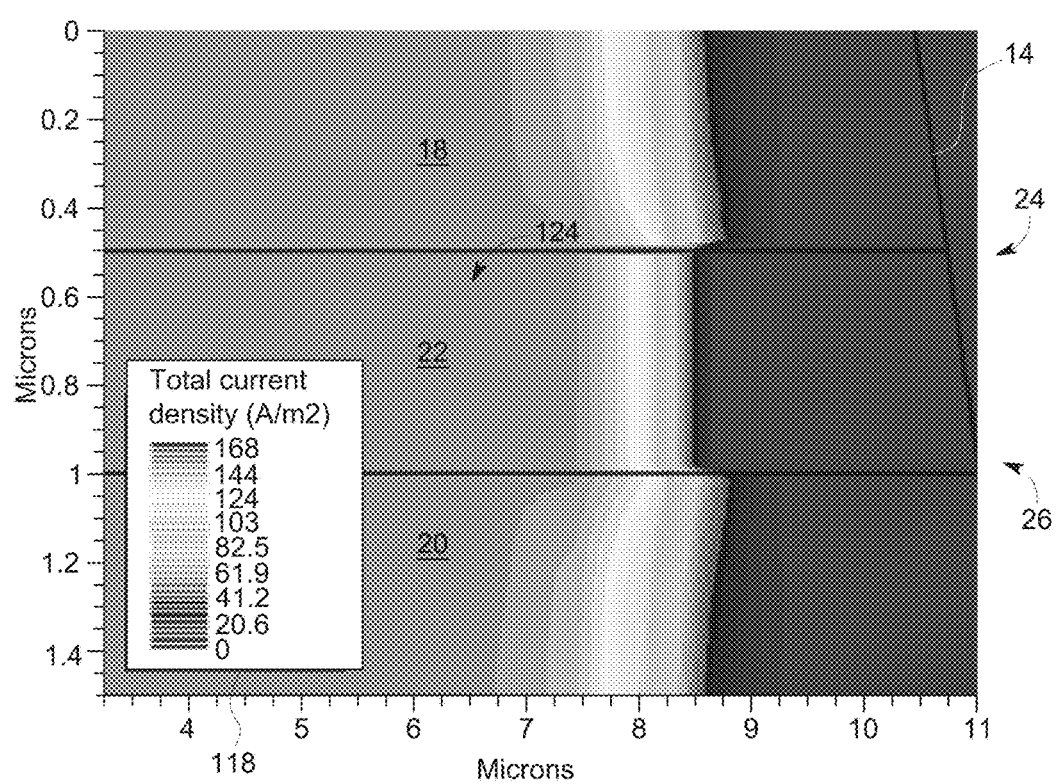
Figure 6C:
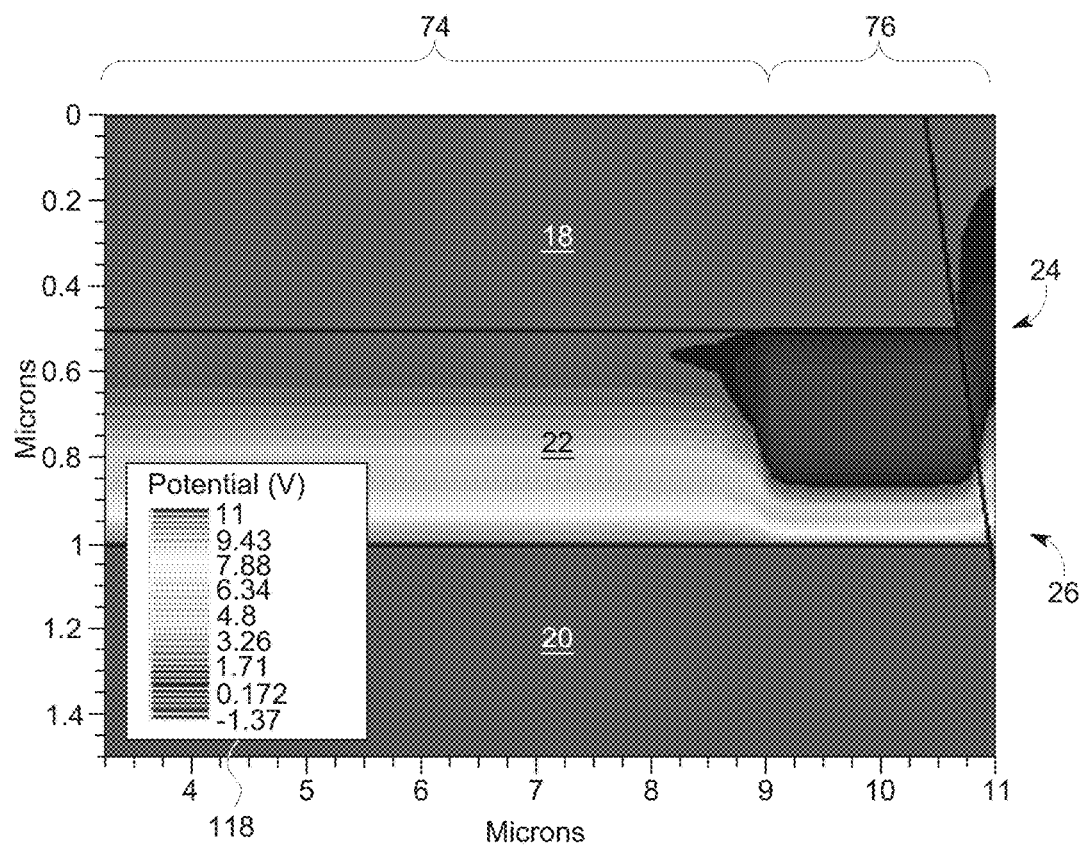
Figure 6D:
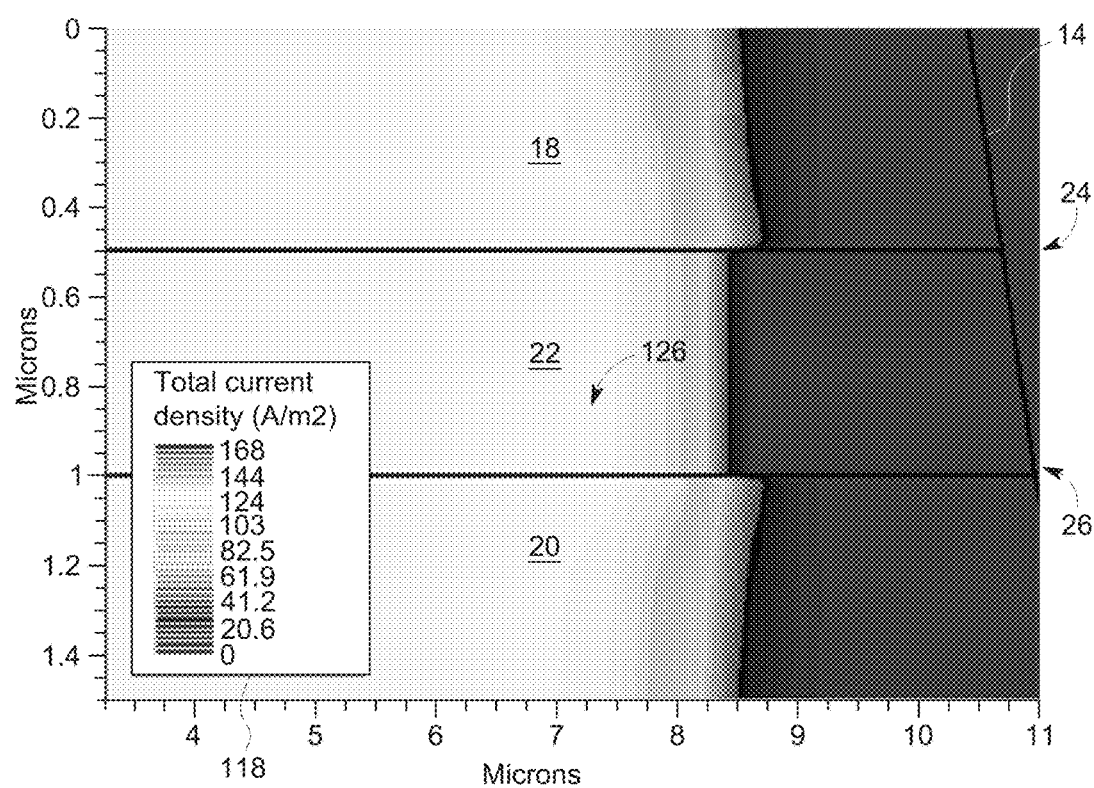
Figure 7A:
FIGS. 7A, 7B, 7C, 7D, and 7E are cross-sectional schematic views illustrating the mesa structure of FIG. 3 at various stages of an example fabrication process, in accordance with embodiments of the present disclosure.
Figure 7B:
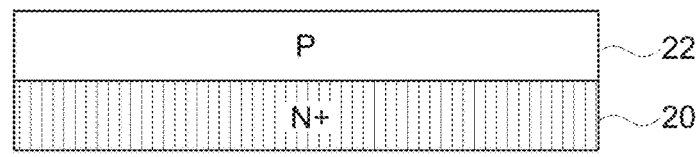
Figure 7C:
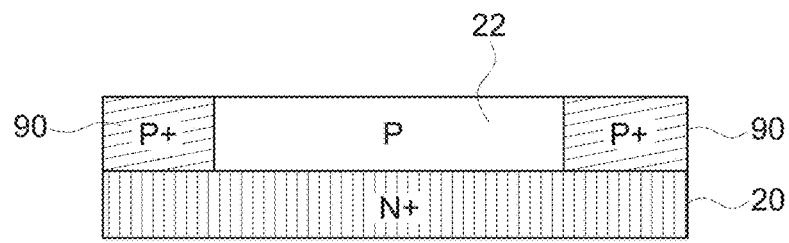
Figure 7D:
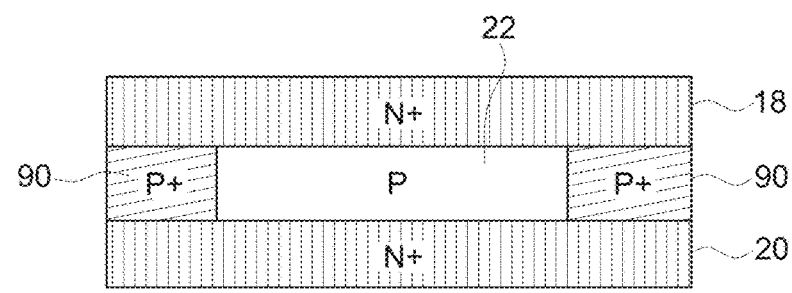
Figure 7E:
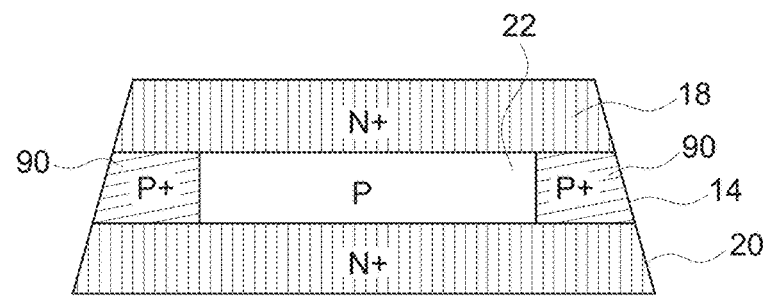
Figure 8A:
FIGS. 8A, 8B, 8C, 8D, and 8E are cross-sectional schematic views illustrating the mesa structure of FIG. 3 at various stages of another example fabrication process, in accordance with embodiments of the present disclosure.
Figure 8B:
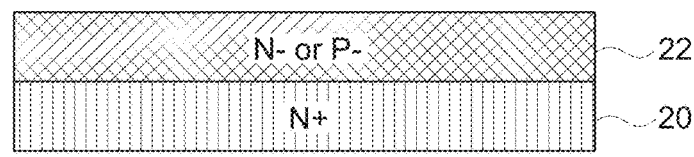
Figure 8C:
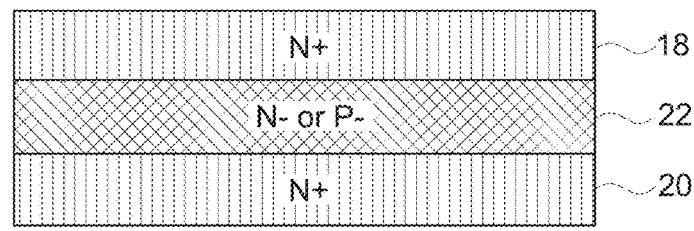
Figure 8D:
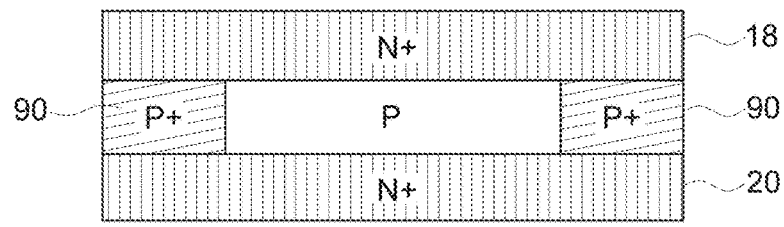
Figure 8E:
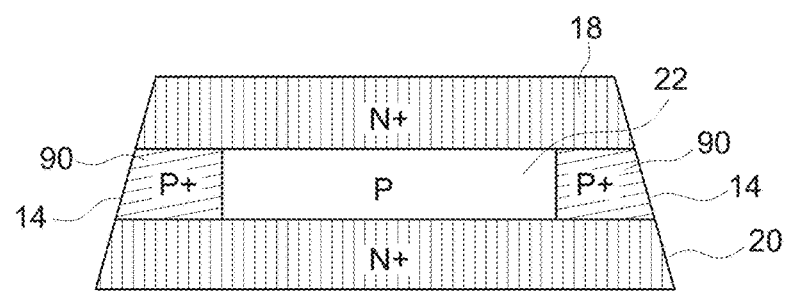

By comparison, FIG. 6A represents the potential distribution, and FIG. 6B the current distribution, for the upper junction 24 of a punch-through TVS device 10 having the mesa structure 12B illustrated in FIG. 3 that includes the edge implants 90 under negative (reverse) bias. FIG. 6C represents the potential distribution, and FIG. 6D the current distribution, for lower junction 26 of the same device under negative (reverse) bias. In sharp contrast to FIGS. 5A-D, as a result of edge implants 90, the punch-through in both the upper and lower junctions 24 and 26 occurs in the bulk region 74 rather than near the lateral edges 76. The primary currents punch-through the upper and lower junctions 24 and 26 in the bulk region as indicated by arrows 124 and 126, respectively, while no leakage current is indicated.

The data presented in FIGS. 5 and 6 is also consistent with the foregoing discussion of FIGS. 2 and 3, demonstrating that the disclosed edge implants 90 are effective in inducing punch through in the bulk region 74 rather than the lateral edges 76, such that the $V_B$ is unaffected by the beveled mesa sidewalls 14. That is, with the disclosed edge implants 90, the mesa angles 52 and/or other interface conditions (e.g., interface roughness) of the mesa sidewalls 14 are substantially less likely to affect the $V_B$ of the punch-through TVS device 10. Accordingly, the disclosed technique may relax and/or eliminate the dependence of device performance on particular mesa etching conditions, resulting in a more manufacturable device with improved reliability. Furthermore, since the depletion widths 71 and 73 are reduced near the lateral edges 76, as illustrated in FIG. 3, the leakage current may also be reduced or eliminated via the disclosed edge implants 90, as illustrated by the comparison of FIGS. 5D and 6D. It is appreciated that these characteristics are highly desirable for TVS devices.

With the foregoing in mind, FIGS. 7 and 8 each illustrates an example method for fabricating the mesa structure 12B, which includes the edge implants 90, as illustrated in FIG. 3. For example, FIGS. 7A-E are cross-sectional schematic views illustrating the mesa structure of FIG. 3 at various stages of an example fabrication process, in accordance with embodiments of the pressure disclosure. As illustrated in FIG. 7A, any suitable epitaxial growth process may be carried out to form the semiconductor layer 20 (e.g., heavily-doped N+ layer 20) having the first conductivity-type on or above the substrate 16 (not shown). As illustrated in 7B, next any suitable epitaxial growth process may be carried out to form the semiconductor layer 22 (e.g., lightly-doped P layer 22) having the second conductivity-type on or above the semiconductor layer 20. Subsequently, as illustrated in FIG. 7C, an ion implantation process may be used to implant or increase an amount of dopants of the second conductivity-type (e.g., P-type dopants) in a lateral edges 76 of the semiconductor layer 22 and form the edge implants 90. Then, as illustrated in FIG. 7D, a suitable epitaxial process may be used to form the semiconductor layer 18 (e.g., heavily-doped N+ layer 18) on or above the semiconductor layer 22. Once the mesa structure 12B of FIG. 7D is formed, an etching process may be used, which forms the mesa structure 12B having beveled mesa sidewalls 14 with edge implants 90, as illustrated in FIG. 7E.

Alternatively, the mesa structure 12B that includes the edge implants 90, as illustrated in FIG. 3, may be fabricated via a method described in FIG. 8. FIGS. 8A-E are cross-sectional schematic views illustrating the mesa structure of FIG. 3 at various stages of another example fabrication process, in accordance with embodiments of the pressure disclosure. As illustrated in FIG. 8A, a suitable epitaxial growth process may be carried out to form the semiconductor layer 20 (e.g., heavily-doped N+ layer 22) having the first conductivity-type on or above the substrate 16 (not shown). As illustrated in FIG. 8B, next, a lightly-doped semiconductor layer 22 having the first or second conductivity-type (e.g., a lightly-doped P layer 22 or a lightly-doped N-layer 22) is formed on or above the semiconductor layer 20. Then, as illustrated in FIG. 8C, another semiconductor layer 18 (e.g., heavily-doped N+ layer 18) having the first conductivity-type is formed on or above the semiconductor layer 22. Subsequently, as illustrated in FIG. 8D, a sufficiently high energy ion implantation process is used to implant dopants of the second conductivity-type (e.g., P-type) in the lightly-doped semiconductor layer 22 to achieve a desired doping profile in the semiconductor layer 22, including the edge implants 90. For example, in certain embodiments, a lightly-doped P-type layer 22 is grown between heavily-doped N+ layers 18 and 20, and the ion implantation process is used to implant or increase the amount of P-type dopants present in the lateral edges 76 of the lightly-doped P-layer 24, forming the heavily-doped P+ edge implants 90. By further example, in certain embodiment, a lightly-doped N-type layer 22 is disposed between heavily-doped N+ layers 18 and 20, and ion implantation is used to implant P-type dopants to convert the N-type layer 22 into the P-type layer 22, and also to implant additional P-type dopants in the lateral edges 76 of the layer 22 to form heavily-doped P+ edge implants 90. Once the mesa structure 12B of FIG. 8D is achieved, an etching process may be used, which forms the mesa structure 12B having beveled mesa sidewalls 14 with edge implants 90, as illustrated in FIG. 8E.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A symmetrical, punch-through transient voltage suppression (TVS) device, comprising:
   a mesa structure disposed on a semiconductor substrate, wherein the mesa structure comprises:
      a first semiconductor layer having a first doping concentration of a first conductivity-type;
      a second semiconductor layer of a second conductivity-type disposed on the first semiconductor layer, wherein the second semiconductor layer comprises:
         a bulk region having a second doping concentration of the second conductivity-type; and
         edge implants disposed at lateral edges of the second semiconductor layer adjacent to the bulk region and having a third doping concentration of the second conductivity-type; and
      a third semiconductor layer of the first conductive-type disposed on the second semiconductor layer, wherein the mesa structure comprises beveled sidewalls that form mesa angles with respect to the semiconductor substrate that are less than 90 degrees, and wherein the edge implants are configured to cause punch-through to occur in the bulk region and not in the lateral edges of the second semiconductor layer.

2. The TVS device of claim 1, wherein a difference between a breakdown voltage of the TVS device under a forward bias ($V_{BP}$) and a breakdown voltage of the TVS device under a reverse bias ($V_{BN}$) is less than about 1% of $V_{BP}$ or $V_{BN}$.

3. The TVS device of claim 1, wherein the TVS device comprises a silicon carbide, gallium nitride, or gallium oxide TVS device.

4. The TVS device of claim 1, wherein area of the edge implants is dependent at least in part on the mesa angle, such that the area of the edge implants is greater when the mesa angle is smaller.

5. The TVS device of claim 1, wherein the edge implants have a dopant concentration that is about 100% to about 150% greater than a dopant concentration of the bulk region.

6. The TVS device of claim 1, wherein a dopant concentration in the first semiconductor layer is approximately equal to a dopant concentration in the third semiconductor layer, and is at least about two orders of magnitude greater than a dopant concentration in the bulk region of the second semiconductor layer.

7. The TVS device of claim 1, wherein the mesa angles are between about 30 degrees and about 85 degrees.

8. A symmetrical punch-through transient voltage suppression (TVS) device, comprising:
   a semiconductor substrate; and
   a mesa structure disposed on the semiconductor substrate, wherein the mesa structure comprises:
      a first N-type semiconductor layer having a first N-type dopant concentration;
      a P-type semiconductor layer disposed on the first N-type semiconductor layer, wherein the P-type semiconductor layer comprises:
         a bulk region having a first P-type dopant concentration; and
         edge implants disposed at lateral edges of the P-type second semiconductor layer adjacent to the bulk region and having a second P-type dopant concentration; and
      a second N-type semiconductor layer having a second N-type dopant concentration disposed on the P-type semiconductor layer, wherein the mesa structure comprises beveled sidewalls that form mesa angles with respect to the semiconductor substrate that are less than 90 degrees, and wherein the edge implants are configured to cause punch-through to occur in the bulk region and not in the lateral edges of the second semiconductor layer.

9. The punch-through TVS device of claim 8, wherein the first N-type dopant concentration is substantially equal to the second N-type dopant concentration.

10. The punch-through TVS device of claim 8, wherein the mesa structure is made of silicon carbide, gallium nitride, or gallium oxide.

11. The punch-through TVS device of claim 8, wherein the edge implants have lateral lengths that that are greater when the mesa angles are smaller.

12. The punch-through TVS device of claim 8, wherein the second P-type dopant concentration is about 100% to about 150% greater than the first P-type dopant concentration.

13. The punch-through TVS device of claim 8, wherein the first N-type dopant concentration is approximately equal to the second N-type dopant concentration and is at least two orders of magnitude greater than the first P-type dopant concentration.

14. The punch-through TVS device of claim 8, wherein the mesa angles are between about 30 degrees and about 85 degrees.

* * * * *